United States Patent [19]
Ishima

[11] Patent Number: 5,115,327
[45] Date of Patent: May 19, 1992

[54] GAIN CONTROL CIRCUIT FOR USE IN SHADING COMPENSATION CIRCUIT

[75] Inventor: Kazumi Ishima, Kashiwa, Japan

[73] Assignee: Ricoh Company, Ltd., Tokyo, Japan

[21] Appl. No.: 487,302

[22] Filed: Mar. 2, 1990

[30] Foreign Application Priority Data

Mar. 3, 1989 [JP] Japan ................................. 1-51396

[51] Int. Cl.⁵ .............................................. H04N 1/40
[52] U.S. Cl. .................................... 358/461; 358/446; 358/464
[58] Field of Search ....................... 358/461, 446, 464

[56] References Cited
U.S. PATENT DOCUMENTS 4,723,174  2/1988  Nishikawa et al. ............... 358/446

OTHER PUBLICATIONS

"Liner Data Manual", Signetics, vol. 2, pp. 5–111, 112, 121, and 122, Nov. 14, 1986.

Primary Examiner—Edward L. Coles, Sr.
Attorney, Agent, or Firm—Oblon, Spivak, McClelland, Maier & Neustadt

[57] ABSTRACT

A gain control circuit used in a shading compensation circuit includes a signal processing circuit for an image signal successively output from each of cells of a line image sensor and a gain control signal corresponding to shading data output from an external signal system and converting the image signal into a signal with level corresponding to the gain control signal and for outputting a compensation image signal, and signal feedback circuit for inverting a reference compensation image signal and holding an inverted version of the reference compensation image signal and for feeding the inverted version of the reference compensation image signal back to a terminal of the signal processing circuit and which the image signal is input.

6 Claims, 11 Drawing Sheets

GAIN CONTROL CIRCUIT FOR USE IN SHADING COMPENSATION CIRCUIT

BACKGROUND OF THE INVENTION

The preset invention relates to a gain control circuit for use in a shading compensation circuit.

In an image reading device applied to a digital copying machine, facsimile machine or the like, a CCD image sensor optically scans a document. Then, the CCD image sensor outputs an image signal for each picture element, each signal corresponding to the image on the document.

The sensitivity of every cell (each cell corresponding to a picture element) of the CCD image sensor is not identical, and even if the CCD image sensor scans a plate having constant density, such as a white reference plate, the amount of incident light on every cell is not equal. Thus, even if the CCD image sensor scans the constant density plate, the level of the image signal output from every cell is not equal. Shading compensation is performed in order to prevent the irregular output of image signals from the CCD image sensor.

During the shading compensation, when the image sensor scans a white reference plate having white constant tone, the image signal output from each cell of the image sensor is controlled so that the level of the image signal from every cell becomes equal. A gain control circuit is used for this control of the image signal.

The gain control circuit includes a digital-to-analog converter (hereinafter termed a D/A converter), for example. The following is a description of a conventional gain control circuit including the D/A converter with reference to FIG. 1.

Figure 1:
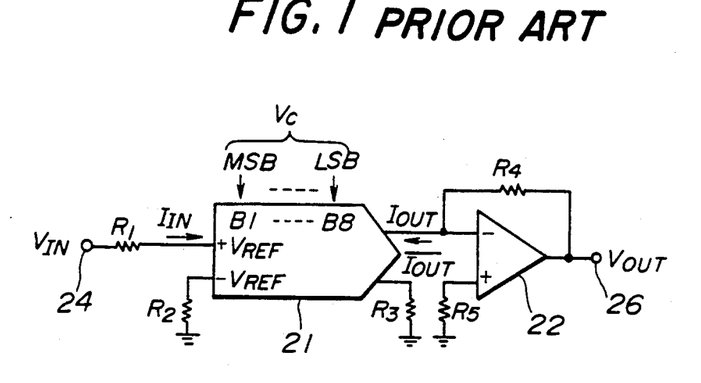
FIG. 1 is a view indicating a configuration of a conventional gain control circuit.

The image signal from each cell of the image sensor is successively input to a terminal 24. When the image signal $V_{IN}$ is input to the terminal 24, a input current $I_{in}$ corresponding to the image signal $V_{IN}$ is supplied to a terminal ($+V_{REF}$) of a D/A converter 21 via a resistor $R_1$. A terminal ($-V_{REF}$) of the D/A converter 21 and the ground are connected by resistor $R_2$. A digital signal which has 8 bits $B_1$(MSB) through $B_8$(LSB) is input to the D/A converter 21. This D/A converter 21 outputs a current $I_{OUT}$ dependent on the value of the digital signal $B_1$ through $B_8$ on the basis of the input current $I_{IN}$. The output current $I_{OUT}$ from the D/A converter 21 is input to an inversion input terminal of an operational amplifier 22. D/A converter 21 outputs another current $\overline{I_{OUT}}$. This output current $\overline{I_{OUT}}$ is supplied to the ground via a resistor $R_3$. A non-inversion input terminal of the operational amplifier 22 and the ground are connected by a resistor $R_5$. In the operational amplifier 22, between the inversion input terminal and an output terminal, a feed back resistor $R_4$ is connected. The output terminal of the operational amplifier 22 is connected to a terminal 26. The output current $I_{OUT}$ from the D/A converter 21 is converted into a voltage $V_{OUT}$ due to a current-voltage conversion function of the operational amplifier 22.

In the gain control circuit having a structure as has been described above, the 8-bit digital signal is a gain control signal $V_C$. That is, a gain $V_{IN}/V_{OUT}$ is controlled according to the value of this gain control signal $V_C$. Then, when the level of the input signal $V_{IN}$ is constant, the relationship between the gain control signal $V_C$ and the output signal $V_{OUT}$ is shown as a solid line as, for example, in FIG. 2. That is, when all bits of the 8-bit gain control signal $V_C$ are height-level (H-level) the gain $V_{IN}/V_{OUT}$ is equal to 1, and when all bits thereof are low-level (L-level) the gain $V_{IN}/V_{OUT}$ is equal to 1/255. Then, the gain is controlled according to the gain control signal $V_C$ in the 1/255 step between 1/255 and 1.

The image signal output from each cell of the CCD sensor is input to the terminal 24. The gain control signal $V_C$ corresponding to each cell of the CCD image sensor is determined so that when the CCD image sensor scans the white reference plate having constant density, the level of the output signal from the terminal 26 of the gain control circuit corresponding to each cell of the CCD image sensor becomes constant. Then, when the CCD image sensor scans the document, the image signal from each cell of the CCD image sensor is input to the terminal 24, and the 8-bit gain control signal $V_C$ which corresponds to the cell of the CCD image sensor is supplied to the D/A converter 21. Whereby, the output signal $V_{OUT}$ from the gain control circuit becomes the image signal for which the shading compensation is performed.

Figure 2:
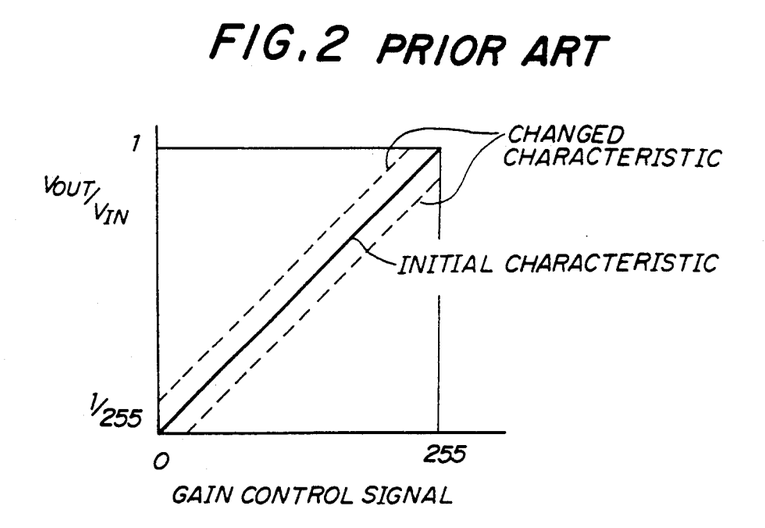
FIG. 2 is a view indicating the gain characteristics of the circuit indicated in FIG. 1.

The output characteristic of the gain control circuit which is described above is changed due to various factors, as is indicated by the dotted lines in FIG. 2. The output characteristic of the gain control circuit is changed continually so that the level of the output signal $V_{OUT}$ from the gain control circuit is fluctuated. It is especially difficult to prevent the changing of the output characteristic caused by an offset current of the operational amplifier 22.

Figure 3:
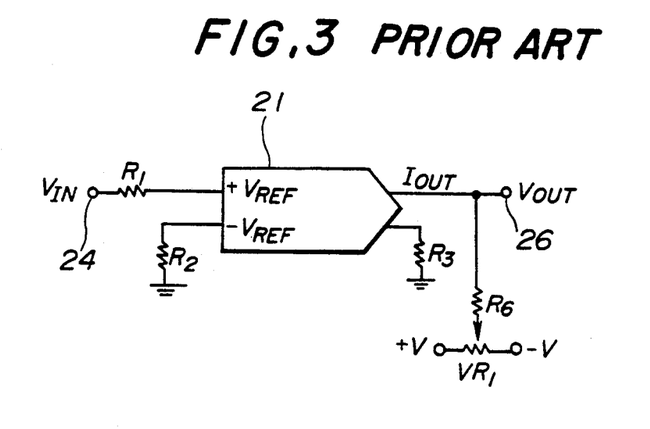
FIG. 3 is a view indicating an example of the configuration of another conventional gain control circuit.

To return the changed output characteristic of the gain control circuit to an initial characteristic (see FIG. 2), the gain control circuit which has a structure shown in FIG. 3 has been proposed (see "Linear Data Manual" Vol. 5–111, 112, 121, 122, Nippon Sigunetikkusu Kabushikikaisha, Nov. 14, 1986).

The gain control circuit shown in FIG. 3 has a variable resistor $VR_1$ which is connected between a+V power source and a-V power source and a resistor $R_6$ connected between the output terminal of the D/A converter 21 and a slidable terminal of the variable resistor $VR_1$. A reference signal having a predetermined level is input to the terminal 24. In this condition, the variable resistor $VR_1$ is manually adjusted so that the relation between the reference signal ($V_{IN}$) and a signal ($V_{OUT}$) output from the terminal 26 when the reference signal is input becomes the initial characteristic, as is indicated by the solid line in FIG. 2. The reference signal has the same level as a signal which is output from the image sensor, this reference signal corresponding to a black image having a predetermined tone, for example.

In the gain control circuit shown in FIG. 3, when a drift of the output signal $V_{OUT}$ occurs due to a fluctuation of environmental temperature or a fluctuation of output voltage of a power source, it is impossible to adjust the drift of the output signal $V_{OUT}$ so as to cancel it, because the variable resistor $VR_1$ must be adjusted manually.

If the gain control circuit is structured by using a high-speed and a little drift type D/C converter and the same type operational amplifier, the disadvantage described above does not occur. However, as these circuit elements are very expensive, use of these circuit element leads to increased product cost.

SUMMARY OF THE INVENTION

Accordingly, a general object of the present invention is to provide a novel and useful gain control circuit for use in a shading compensation circuit in which the disadvantages of the aforementioned prior art are eliminated.

A more specific object of the present invention is to provide a gain control circuit for use in a shading compensation circuit which produces a stable image signal output even when changes in environmental temperature and the power voltage cause fluctuations in the characteristics of the circuit element.

These objects of the present invention is achieved by a gain control circuit for use in a shading compensation circuit comprising, signal processing means for inputting an image signal successively output from each of cells image signal successively output from each of cells of a line image sensor and a gain control signal corresponding to shading data output from an external signal system and converting the image signal into a signal with a level corresponding to the gain control signal and for outputting a converted version of the signal as a compensation image signal, and signal feedback means for inverting a reference compensation image signal and holding an inverted version of the reference compensation image signal and for feeding the inverted version of the reference compensation image signal back to a terminal of the signal processing means and to which the image signal is input, the reference compensation signal obtained from the signal processing means when a reference gain control signal having a predetermined value and obtained from the external signal system and a reference image signal having a predetermined reference level and which is included in predetermined part of the image signal are input to the image processing means.

Another object of the present invention is to provide a gain control circuit which produces a stable image signal output even when the image signal level changes in either the positive or the negative direction.

The above object of the present invention is achieved by a gain control circuit further comprising bias means for shifting a level of the image signal input to the terminal of the signal processing means, by a predetermined level.

Other objects and further features of the present invention will be apparent from the following detailed description when read in conjunction with the accompanying drawings.

BRIEF DESCRIPTION OF THE DRAWINGS

FIGS. 8a-d are output timing charts of the image sensor;

FIGS. 9a-i are waveform diagrams indicating a signal input to the signal control circuit;

DESCRIPTION OF THE PREFERRED EMBODIMENTS

Figure 4:
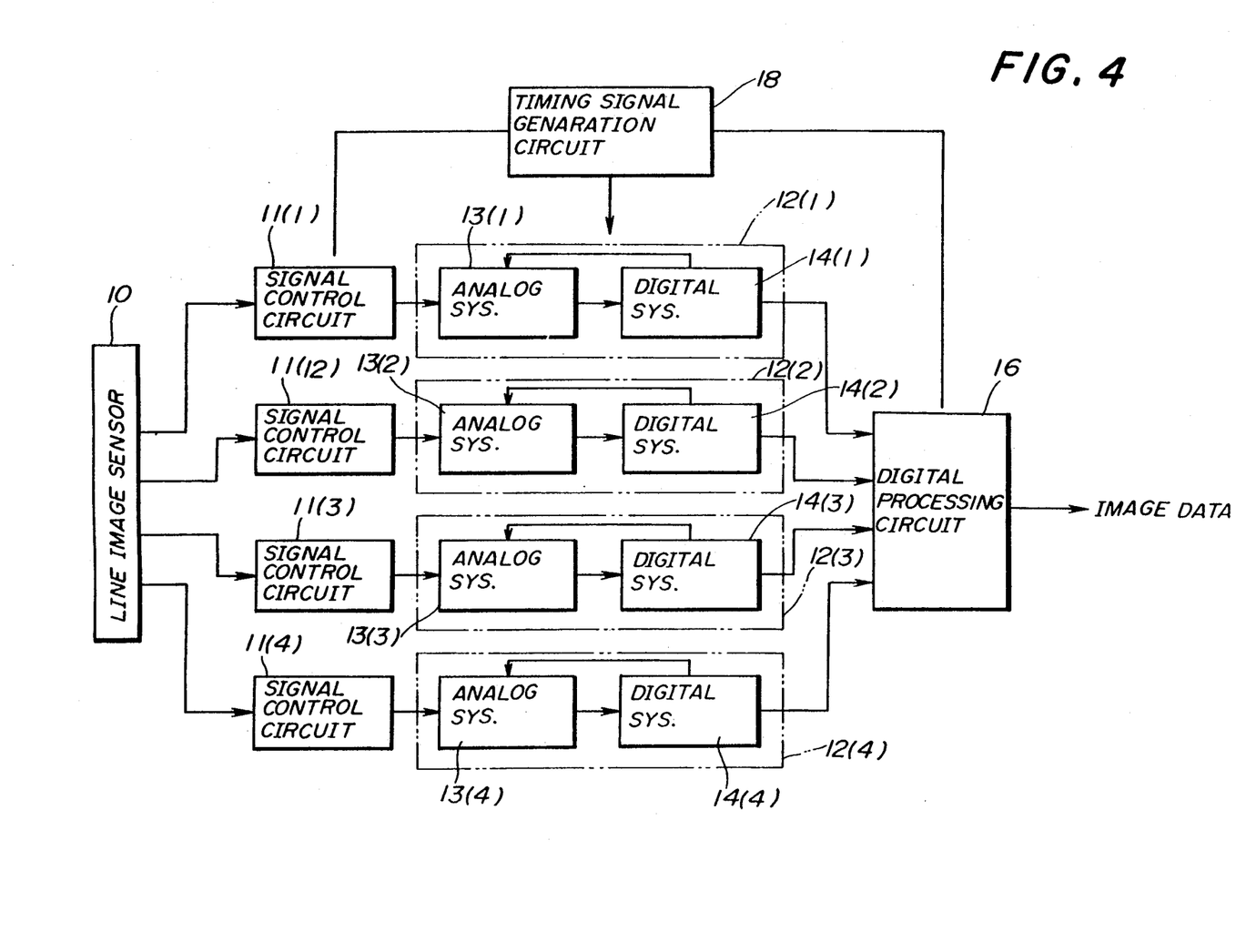
FIG. 4 is a block diagram of a fundamental configuration of an image reading apparatus to which a gain control circuit according to the present invention has been applied.

The following is a description of the fundamental structure of an image reading device including a shading compensation circuit, with reference to FIG. 4.

A line image sensor 10 for scanning the document is divided into four sensor chip as shown in FIG. 2. The sensor chips 10(1) through 10(4) are arranged on a reading line. The adjacent sensor chips, such as chips 10(1) and 10(2), overlap slightly in the direction perpendicular with respect to the reading line. This is to say that the sensor chips 10(1) through 10(4) are staggered. Effective read lengths l of the sensor chips 10(1) through 10(4) are mutually identical. An effective read length L of the line image sensor 10 is equal to the sum of the effective read lengths l of the sensor chips 10(1) through 10(4), that is to say, 4l. Image signals are output from the sensor chips 10(1) through 10(4) in parallel. The four image signals output in parallel from the line image sensor 10 are input to signal control circuits 11(1) through 11(4). The signal control circuits 11(1) through 11(4) have an automatic gain control function, a black level control function and an offset elimination function. In automatic gain control function is such the gain of the circuit is controlled so that a white signal level is maintained at a constant level even if the light source irradiates irregularly. The white signal is a signal which is obtained when a white reference plate having a predetermined density is read by the line image sensor 10. Due to the automatic gain control function, the signal level corresponding to white is stabilized. The black level control function is such a dc component which is included in the output signal from the line image sensor 10 is eliminated. Furthermore, the fluctuation of the signal level corresponding to black, and which due to a dark current of in the line image sensor 10 is prevented. In the offset elimination function, an offset voltage of an amplifier in the signal control circuit itself is eliminated.

Signals output from the signal control circuits 11(1) through 11(4) are input to shading compensation circuits 12(1) through 12(4). The following is a description of the shading compensation circuits 12(1). Each of the other shading compensation circuits 12(2) through 12(4)

has the same structure as the shading compensation circuit 12(1).

A shading compensation circuit 12(1) has an analog system 13(1) and a digital system 14(1). The analog system 13(1) has a gain control circuit according to the present invention. The digital system 14(1) has a storage memory that stores the shading compensation data determined with respect to each of the cells of the line image sensor 10. When image signals from a signal control circuit 11(1) are input to the analog system 13(1), the gain control circuit inside this analog system 13(1) performs gain control on the basis of the shading compensation data supplied from the digital system 14(1). This shading compensation data is supplied to the gain control circuit as gain control signals.

Because of this shading compensation circuits 12(1), the level of the image signals obtained with respect to each of the cells of the sensor chip 10(1) does not change even if there are discrepancies in the sensitivity of each of the cells of the sensor chip 10(1). The image signals (digital signals) obtained from the shading compensation circuits 12(1) through 12(4) are input to a digital processing circuit 16. This digital processing circuit 16 converts the four systems of image signals input in parallel from the shading compensation circuits 12(1) through 12(4), into series image data for one line. The digital processing circuit 16 outputs the image data in series and in predetermined picture element units.

The signal control circuits 11(1) through 11(4), shading compensation circuits 12(1) through 12(4) and the digital processing circuit 16 described above perform their respective processing in accordance with predetermined timing signals. The timing signals are supplied from a timing signal generation circuit 18. This timing signal generation circuit 18 uses the base clock signal from a CPU (not indicated in the figure) to generate each of the respective timing signals for the corresponding processing.

Figure 6:
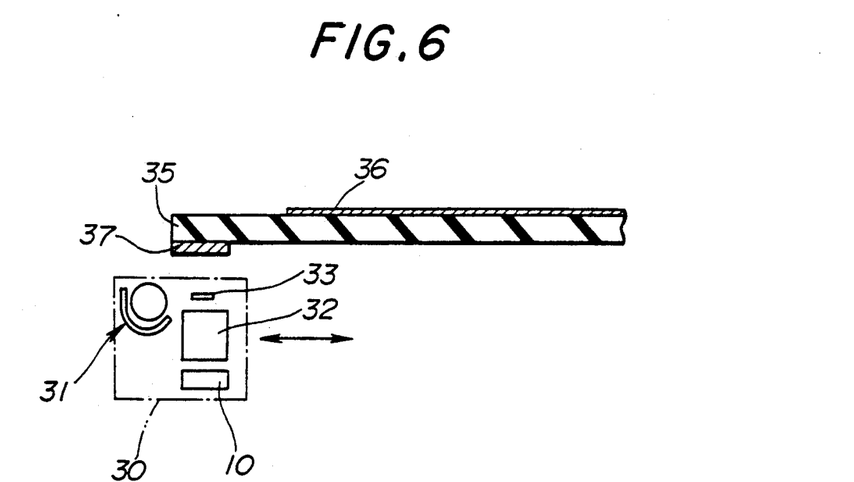
FIG. 6 is a view indicating a structure of a scanning system.

The fundamental configuration of a scanning system including a line image sensor 10 is indicated in FIG. 6.

A carriage 30 is disposed in a bottom portion of a platen glass 35 on which an original 36 is placed. The carriage 30 has a line image sensor 10, a fluorescent lamp 31, a lens array 32 and a first white reference plate 33. The carriage 30 moves parallel to the platen glass 35, as indicated by the arrow in FIG. 6. While the carriage 30 is moving, the fluorescent lamp 31 irradiates light onto the original 36. Then, the light reflected by the surface of the original 36 passes through the lens array 32 and is irradiated to the line image sensor 10. The first white reference plate 33 inside the carriage 30 is used to generate reference signals for the automatic gain control in the previously described signal control circuit 11(1). The rear surface of the platen glass 35 is provided with a second white reference plate 37. This second white reference plate 37 is used to generate reference signals for shading compensation.

Figure 5:
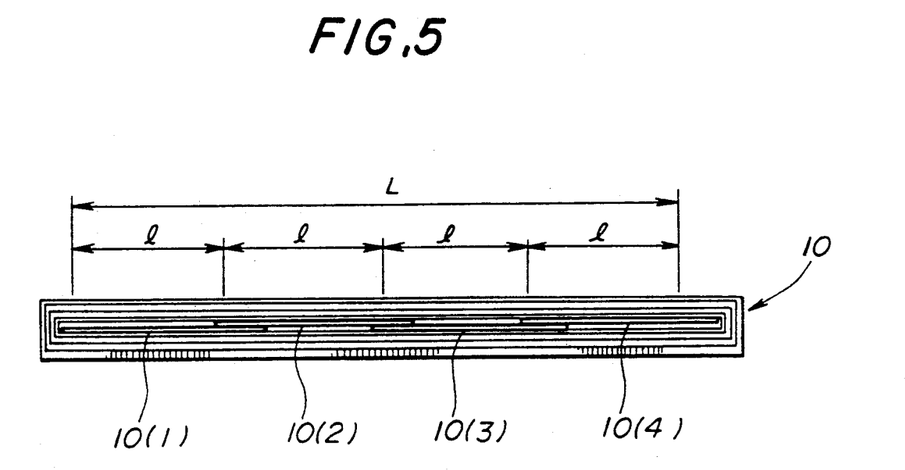
FIG. 5 is a view indicating a structure of an image sensor.
Figure 7:
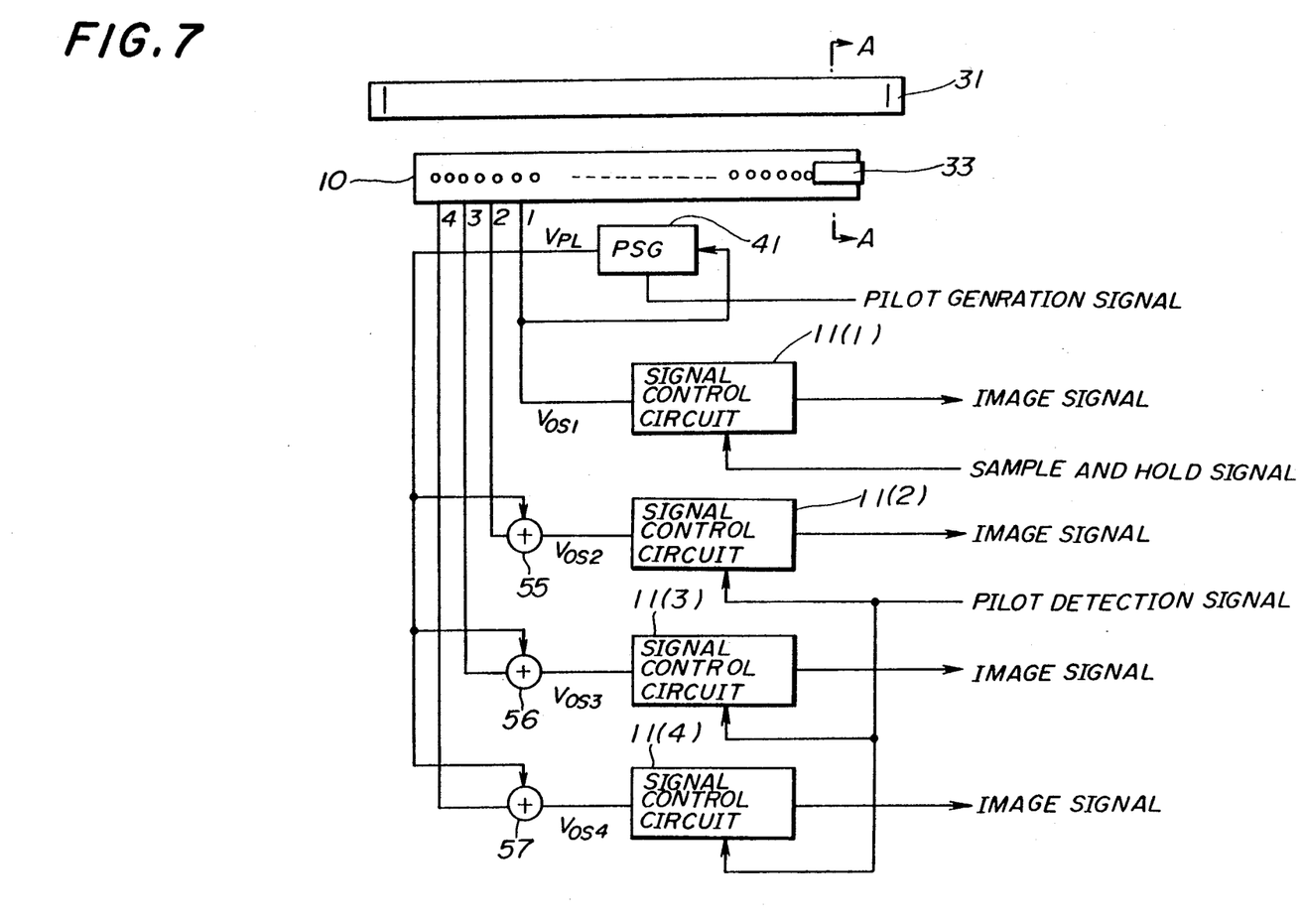
FIG. 7 is a view indicating the relationship of connections between a signal control circuit and the image sensor.

The first white reference plate 33 is positioned at an end of the line image sensor 10, that is to say, the first white reference plate 33 is disposed with respect to sensor chip 10(1) or 10(4) in FIG. 5. Furthermore, this first white reference plate 33 is disposed on the outside of the effective image area of the sensor chip at this end. Image signals from cells outside of this effective image area of the sensor chip are effectively not used as image information. The first white reference plate 33 is irradiated with light from the fluorescent lamp 31. The light reflected by the first white reference plate 33 is irradiated to each of the cells facing the first white reference plate 33. Then, while the fluorescent lamp 31 is lit, reference while signal having a level corresponding to the white tone of the first white reference plate 33 is output from each of the cells facing the first white reference plate 33. FIG. 7 shows each of the cells of each of the sensor chips along the same line for the sake of simplicity.

In addition, FIG. 7 shows the connection status of the signal control circuits 11(1) through 11(4) and the line image sensor 10.

The image signal $V_{OS1}$ from the first sensor chip 10(1) of the line image sensor 10 is input to the signal control circuit 11(1) and the image signal $V_{O2}$ from the second sensor chip 10(2) is input to the signal control circuit 11(2) via an adder 55, the image signal $V_{O3}$ from the third sensor chip 10(3) is input to the signal control circuit 11(3) via an adder 56 and the image signal $V_{O4}$ from the fourth sensor chip 10(4) is input to the signal control circuit 11(4) via an adder 57. The image signal $V_{OS1}$ from the first sensor chip 10(1) is also input to a pilot signal generating circuit 41. The pilot signal generating circuit 41 generates the pilot signal $V_{PL}$ on the basis of the image signal $V_{OS1}$ from the first sensor chip 10(1) and in synchronization with the pilot generation signal. The pilot signal generating circuit 41 samples and holds the reference white signal (included in the image signal $V_{OS1}$) from the first sensor chip 10(1). Then, while this pilot generation signal is effective, the pilot signal generating circuit 41 outputs the sampled and held reference white signal as the pilot signal $V_{PL}$. The pilot signal $V_{PL}$ output from the pilot signal generating circuit 41 is input to the adders 55, 56 and 57. Then, the pilot signal $V_{PL}$ is added to each of the image signals $V_{OS2}$, $V_{OS3}$ and $V_{OS4}$ from the second, third and fourth sensor chips 10(2) through 10(4).

Figures 8, 8A:
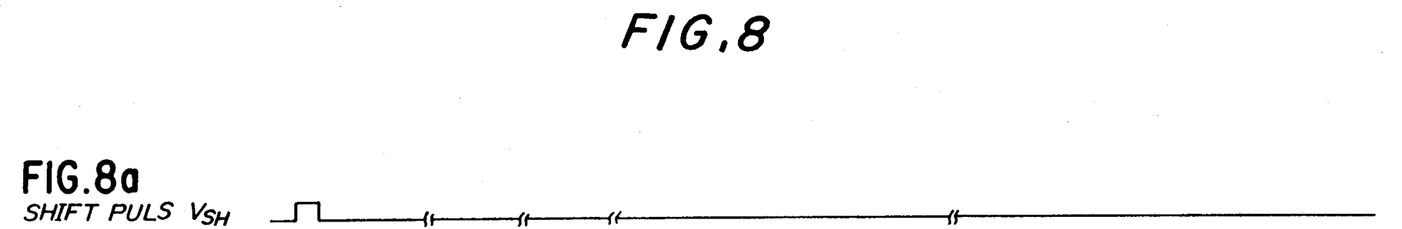
Figures 8B, 8C:
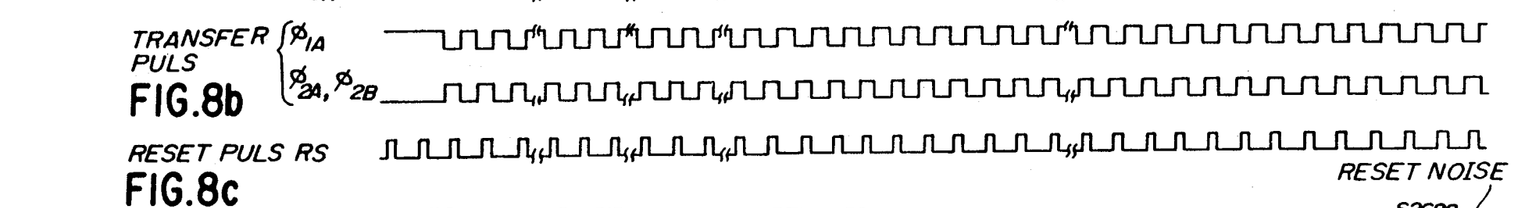
Figure 8D:
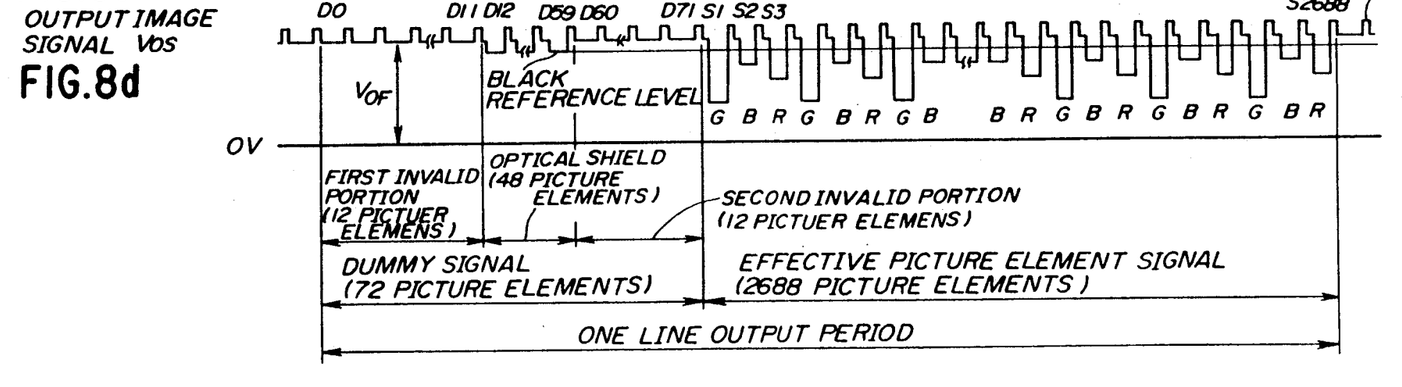

Each of the sensor chips 10(1) through 10(4) of the line image sensor 10 output image signals for one line, in accordance with the timing chart indicated in FIG. 8.

The output timing of the image signal $V_{OS}$ from the line image sensor 10 is controlled by a shift pulse $V_{SH}$ (supplied for each line), transfer pulses $\phi 1A$, $\phi 2A$, $\phi 2B$ and a reset pulse RS. Due to this timing control, image signals $V_{OS}$ so as to formed pulse strings are output from each of the sensor chips 10(1) through 10(4). Normally, the image signal $V_{OS}$ from the line image sensor 10 has an offset voltage $V_{OF}$. In addition, the image signal $V_{OS}$ is included in a signal known as reset noise. The image signal $V_{OS}$ for each one line (one line of each sensor chip) comprises a dummy signal portion and an effective picture element signal portion. For example, when one line comprises 2760 picture elements the dummy signal portion comprises 72 picture elements from the head of one line, and the effective picture element signal portion comprises the 2688 picture elements from after the dummy signal portion. The dummy signal is not handled as a normal image signal and this dummy signal comprises a first invalid portion (the twelve picture elements $D_0$ through $D_{11}$), an optical shield picture element signal portion (the 48 picture elements $D_{12}$ through $D_{59}$) and a second invalid portion (the twelve picture elements $D_{60}$ through $D_{71}$). The signals of the first and the second invalid portions are not used in any way. The cell corresponding to the optical shield picture element signal portion is optically shielded. Because of this, the signals from this portion are image signals corresponding to "black" and are used as black reference signals. In addition, the pilot generation signal described above for the second invalid portion becomes effective and the pilot signal $V_{PL}$ is added to this portion. Following after dummy signal, the effective picture element signals comprise the color image signals repeating in the order of G, B, R. With respect to the first sensor chip 10(1), the portion from the head of the effective picture element signal, for example, the portion corresponding to 100 picture elements, becomes the reference white signal.

During the time that one line is scanned, the status of the signal input with respect to each of the signal control circuits 11(1) through 11(4) is as shown in FIG. 9.

Figure 9A:
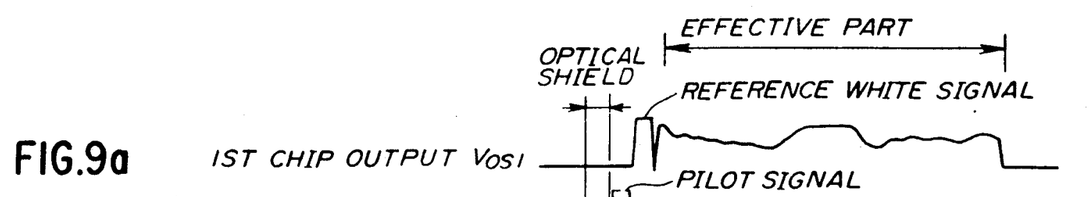
Figures 9B, 9C, 9D, 9E:
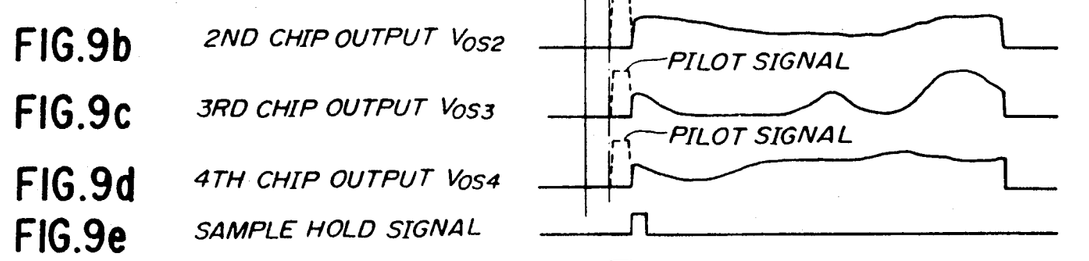
Figure 9F:
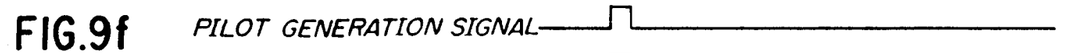
Figure 9G:
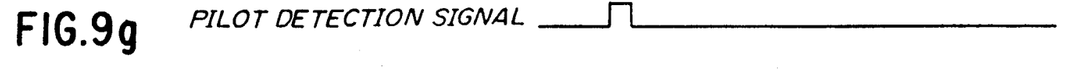
Figure 9H:
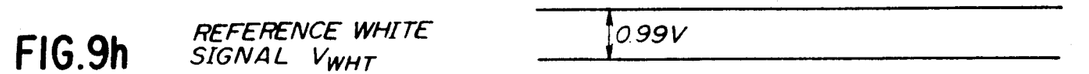
Figure 9I:
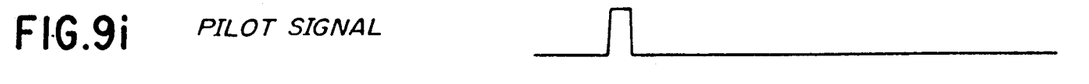

The image signal $V_{OS1}$ from the first sensor chip 10(1) and input to the signal control circuit 11(1) has a reference white signal after the dummy signal portion. Each of the remaining image signals $V_{OS2}$, $V_{OS3}$ and $V_{OS4}$ from the second, third and fourth sensor chips 10(2) through 10(4) and input to the signal control circuits 11(2) through 11(4) have a pilot signal immediately after the optically shielded image signal portion in the dummy signal portion. The sampled white signal is generated, is input to the first sensor chip 10(1). The pilot generation signal which is effective at the timing when the pilot signal is generated is input to the pilot signal generating circuit 41. In addition, the pilot detect signal which in the same manner, is effective at the timing when the pilot signal is generated, is input each of the signal control circuits 10(2) through 10(3). The pilot signal generating circuit 41 holds a reference white signal that has a level of, for example, 0.99 V, and during the time that the pilot generation signal is effective, this reference white signal is output from the pilot generating circuit 41 as the pilot signal $V_{PL}$. The optically shielded picture element signals in each of the image signals $V_{OS1}$ through $V_{OS4}$ are input to each of the signal control circuits 11(1) through 11(4) as the black reference signals.

Figure 10:
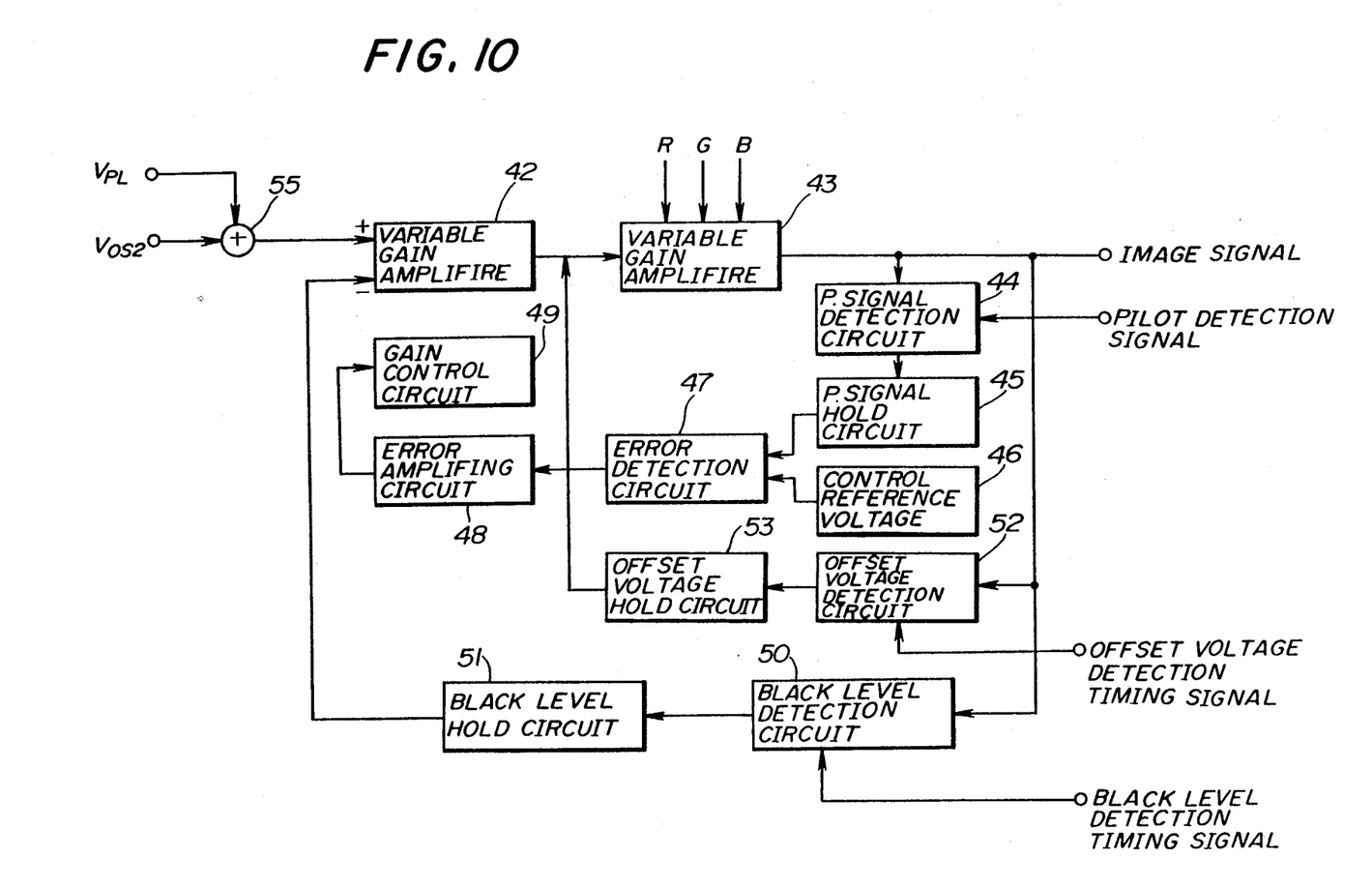
FIG. 10 is a block diagram indicating a fundamental configuration of the signal control circuit.

Each of the signal control circuits 11(1) through 11(4) is structured as indicated in FIG. 10. The configuration of each of the signal control circuits 11(1) through 11(4) is the same and so the description will be given for the signal control circuits 11(2) for processing the image signal $V_{OS2}$ from the second sensor chip 10(2), with reference to FIG. 10.

The image signal $V_{OS}$ is input to a first gain variable amplifier 42 via the adder 55. The signal from the first gain variable amplifier 42 is also input to a second gain variable amplifier 43. The cells of the line image sensor 10 have a different sensitivity with respect to each of the color components (R, G, B) and so the gain of the second gain variable amplifier 43 is individually controlled with respect to the signals of each of the color components so that the signal levels of each of the color components are made even. The output signals from the second gain variable amplifier 43 become the final image signals processed by the signal control circuit 11(2).

The signals from the second gain variable amplifier 43 are input to a pilot signal detect circuit 44. The pilot signal detect circuit 44 samples the pilot signal $V_{PL}$ added to the image signal $V_{OS}$ for each time the pilot detect signal becomes effective. This pilot detect signal becomes effective at the same timing as the pilot generation signal (supplied to the pilot signal generating circuit 41). The pilot signal $V_{PL}$ sampled by the pilot signal detect circuit 44 is held by the pilot signal hold circuit 45 until a new pilot signal $V_{PL}$ is sampled. The pilot signal $V_{PL}$ held in the pilot signal hold circuit 45 and the control reference voltage output from the reference power source 46 are input to an error detect circuit 47. The error detect circuit 47 outputs an error signal with a level which is the difference of between the level of the pilot signal $V_{PL}$ and the level of the control reference voltage. This error signal is input to the gain control circuit 49 via the error amplifying circuit 48. The gain control circuit 49 controls the gain of the first gain variable amplifier 42 in accordance with these error signal. If the level of the error signal is large, then the gain of the first gain variable amplifier 42 is controlled so as to become large, and if the level of the error signal becomes small, then the gain of the first gain variable amplifier 42 is controlled so as to become large, and if the level of the error signal becomes small, then the gain of the first gain variable amplifier 42 is controlled so as to become small.

At the signal control circuit 10(1) that processes the image signal $V_{OS1}$ from the first sensor chip 10(1), the pilot signal detect circuit 44 samples the reference white signal and the sampled reference white signal is held in the pilot signal hold circuit 45. Then, this held reference white signal is used as the basis for controlling the gain of the first gain variable amplifier 42 in the same manner as has been described above.

The following is a more detailed description of the control of the gain of the first gain variable amplifier 42.

When the reference voltage is $V_{REF}=1(V)$ and the reference white signal is $V_{WHT}=0.99(V)$ and the amplification ratio of the error amplifying circuit 48 is A, then the error signal $V_{ERR}$ becomes:

$$V_{ERR}=A(V_{REF}-V_{WHT}).$$

If $A=100$ (times), then the error signal $V_{ERR}$ becomes:

$$V_{ERR}=100(1-0.99)=1(V)$$

Figure 11:
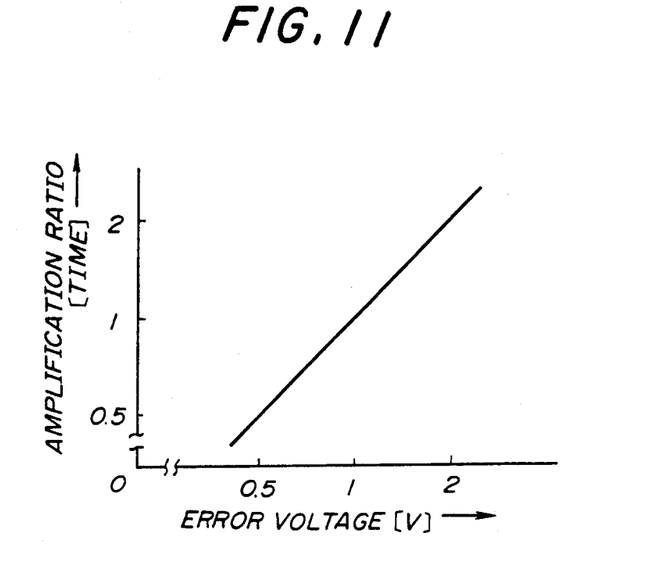
FIG. 11 is a view indicating the characteristics of the error amplifying circuit indicated in FIG. 10.

The gain control circuit 49 controls the gain of the first gain variable amplifier 42 in accordance with the relationship between the error voltage ($V_{ERR}$) and the amplification ratio (gain) indicated in FIG. 11. According to the characteristics indicated in FIG. 11, when $V_{ERR}=1(V)$, the gain becomes "1". In the standard status that has been described above, when the light output of the fluorescent lamp 31 lowers, the reference white signal $V_{WHT}$ also lowers. When $V_{WHT}=0.98(V)$, the gain control system operates so as to satisfy the above formula and so the gain of the first gain variable amplifier 42 is stable at $0.99/0.98 \approx 1.01$ (times).

This is to say that $V_{ERR}=1.01(V)$. After control such as this, the reference white signal $V_{WHT}$ becomes:

$$1.01 = 1.00 \cdot (1 - V_{WHT})$$
$$V_{WHT} = 1 - \frac{1.01}{100} \approx 0.99(V)$$

This is to say that it is the same as the reference white signal prior to the change in the light output.

The function that has been described above is the automatic gain control function. Because of this function, fluctuation in the level of the image signal $V_{OS}$ caused by changes with time in the power voltage, the light output of the fluorescent lamp 31, and other causes is prevented.

Again, with reference to FIG. 10, the signal from the second gain variable amplifier 43 is input to a black level detect circuit 50. The black level detect circuit 50 samples the image signal $V_{OS2}$ in synchronization with a black level detect signal. The black level detect signal is effective in one line, for the output timing of the black reference signal is effective in one line, for the output timing of the black reference signal that has been described earlier. Because of this, the black level detect circuit 50 samples the black reference signal. The black reference signal sampled by the black level detect circuit 50 is held in the black level hold circuit 51. The black level hold circuit 51 inverts the black reference signal and holds it. The inverted black reference signal held in the black level hold circuit 51 is fed back to the first gain variable amplifier 42.

Due to the configuration that has been described above, the black reference signal is always removed from the image signal $V_{OS2}$. Thus, the fluctuation of the black level caused by dark current is removed and the reproduction of black images is improved as a consequence.

Furthermore, the signals from the second gain variable amplifier 43 are input to an offset voltage detect circuit 52. The offset voltage detect circuit 52 samples the offset voltage in the image signal $V_{OS2}$ in synchronization with an offset voltage detect timing signal. These sampled offset voltage is inverted and held in an offset voltage hold circuit 53. Then, the inverted and held offset voltage is fed back to the second gain variable amplifier 43. Due to this configuration, the offset voltage that is included in the image signal $V_{OS2}$ is removed.

The image signals that have various types of processing performed by the above described signal control circuits 11(1) through 11(4) are input to the shading compensation circuits 12(1) through 12(4).

Figure 12:
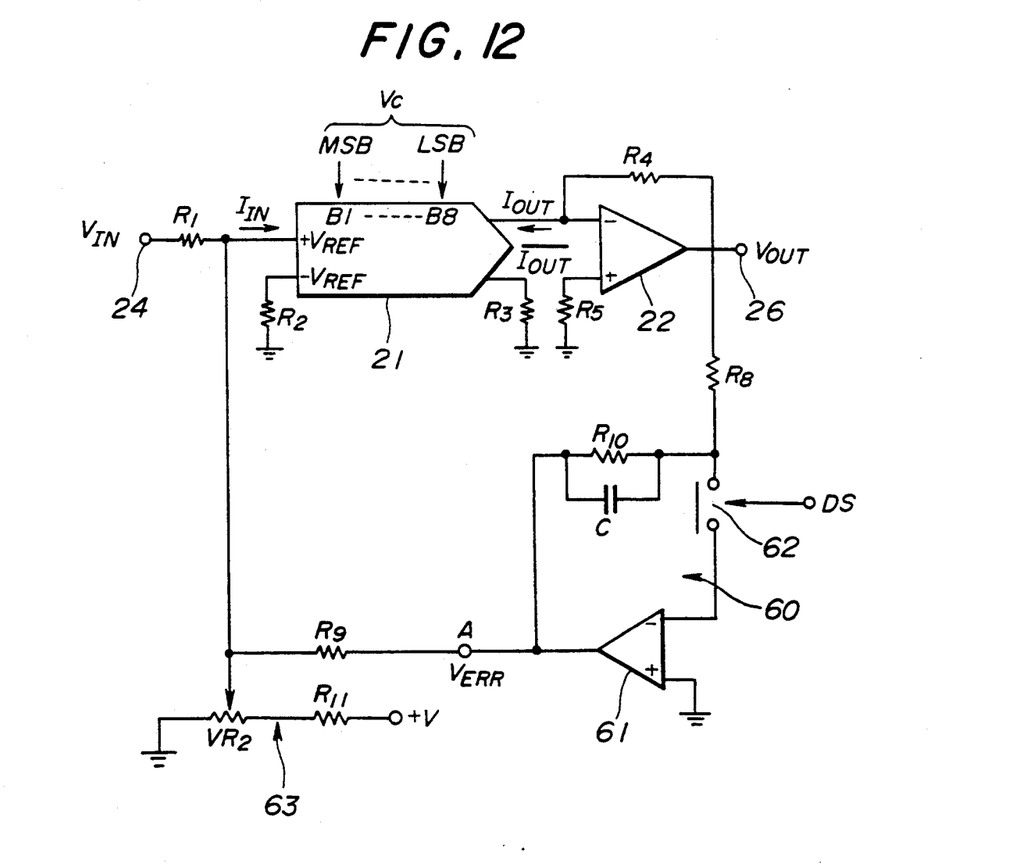
FIG. 12 is a view indicating a first embodiment of the gain control circuit according to the present invention.
Figure 13:
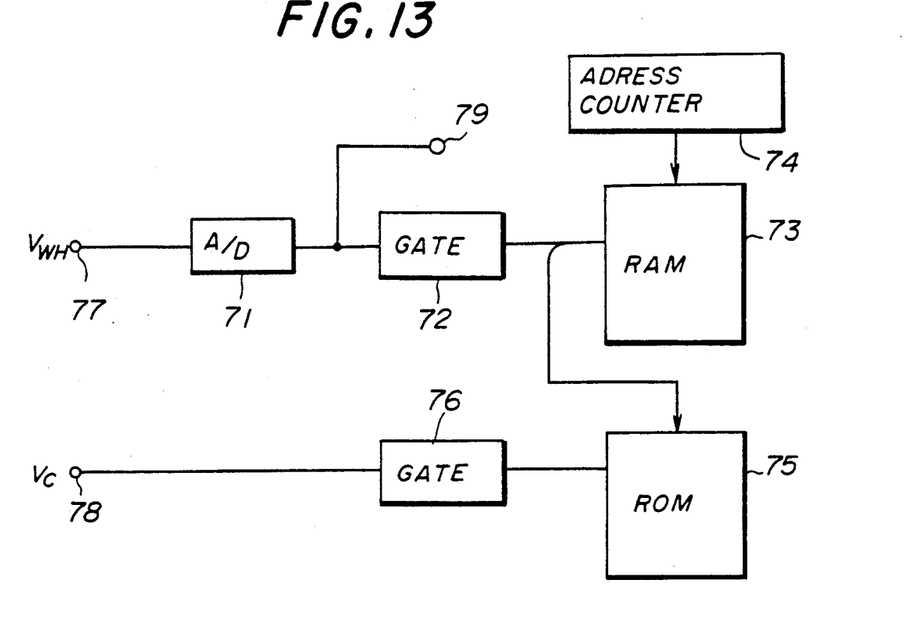
FIG. 13 is a block diagram indicating a fundamental configuration of a digital system of a shading compensation circuit.

Each of the analog systems 13(1) through 13(4) in these shading compensation circuits 12(1) through 12(4) includes a gain control circuit indicated in FIG. 12, and each of the digital systems 14(1) through 14(4) have a memory circuit as indicated in FIG. 13. Each of the shading compensation circuits 12(1) through 12(4) have the same configuration and so the following description will refer only to the shading compensation circuit 12(1). FIG. 12 indicates a gain control circuit according to the present invention. In FIG. 12, those parts that are the same as corresponding parts in FIG. 1 are indicated with the same numbers.

In the same manner as in FIG. 1, the resistor $R_1$, the D/A converter 21 and the operational amplifier 24 are connected in series between the terminal 24 to which the image signal $V_{OS1}$ from the signal control circuit 11(1) is input, and the terminal 26. The output signal from the operational amplifier 24 is input to the inversion terminal of the operational amplifier 61. The non-inversion terminal of the operational amplifier 61 is connected to the ground. A resistor $R_{10}$ and a capacitor $C_1$ are connected in parallel between the output terminal of the operational amplifier 61, and a contact point of an analog switch 62 and a resistor $R_{10}$. The operational amplifier 61, the resistor $R_{10}$, the capacitor $C_1$ and the analog switch 62 comprise an inversion hold circuit 60. The output signal from this inversion hold circuit 60 is fed back to the reference input terminal ($+V_{REF}$) of the D/A converter 21, via a resistor $R_9$.

In the inversion hold circuit 60, when the analog switch 62 turns on with the timing signal $\overline{DS}$, the operational amplifier 61 inverts the output signals from the operational. Then, the capacitor $C_1$ is charged by those inverted signal. The capacitor $C_1$ holds the voltage for longer than the scan time for one line. The charge voltage of the capacitor $C_1$ is the hold voltage of this inversion hold circuit 60. This hold voltage is output from this inversion hold circuit 60 as the error voltage signal $V_{ERR}$.

A variable resistor $VR_2$ and a resistor $R_1$ are connected in series between a power source of the output voltage $+V$ and the ground. The moving terminal of this variable resistor $VR_2$ is connected to the reference terminal ($+V_{REF}$) of the D/A converter 21. The variable resistor $VR_2$ and the resistor $R_1$ connected between the power and the ground comprise a bias circuit 63. This bias circuit 63 applies a bias of a predetermined voltage to the reference input terminal ($+V_{REF}$) of the D/A converter 21 so that an operating point of the D/A converter 21 is always held to positive. The bias voltage is adjusted by adjusting the variable resistor $VR_2$.

A following description will be given of the memory circuit with reference to FIG. 13.

The output signals $V_{OUT}$ (image out) from the gain control circuit indicated in FIG. 12 is input to a terminal 77. The image signal input to the terminal 77 is converted to a digital signal by the analog-to-digital converter 71. This memory circuit also has a gate 72, a RAM (random access memory) 73 and an address counter 74. In addition, the data that is read from the RAM 73 is input as an address to a ROM (read only memory) 75. Shading compensation data is stored beforehand in the ROM 75. The shading compensation data is stored beforehand in the ROM 75. The shading compensation data that is read from the ROM 75 is output via the gate 76 as a gate control signal $V_C$ from the terminal 78. This gate control signal $V_C$ output from the terminal 78 is input to the digital input terminals ($B_1$ through $B_8$) of the D/A converter 21.

The following is a description of the operation of a shading compensation circuit 12(1) having the configuration that is described as above.

While the carriage 30 is scanning the second white reference plate 37 in FIG. 6, the white signals $V_{WT}$ output from the line image sensor 10 are successively stored in the RAM 73 of the shading compensation circuit 12(1) via the signal control circuit 11(1) and the analog system 13(1) of the shading compensation circuit 12(1). When this occurs, the gain control signal $V_C$ is set to a predetermined value. This data (white signal $V_{WT}$) stored in this RAM 73 express an output distribution of the cells of the line image sensor 10. Then, when the scanning of the original 36 starts, shading compensation data corresponding to the output distribution data of the cells written in the RAM 73 are read out from the ROM 75. Then, on the basis of the shading compensation data (gain control signal $V_C$) that is read out from the ROM 75, the gain of the gain control circuit is controlled in accordance with each cell. Thus, the image data becomes uniform even if the output distribution of each cell of the line image sensor 10 is not uniform. Then, the stabilized image data is output from the terminal 79 of the digital system 14(1).

Figure 14:
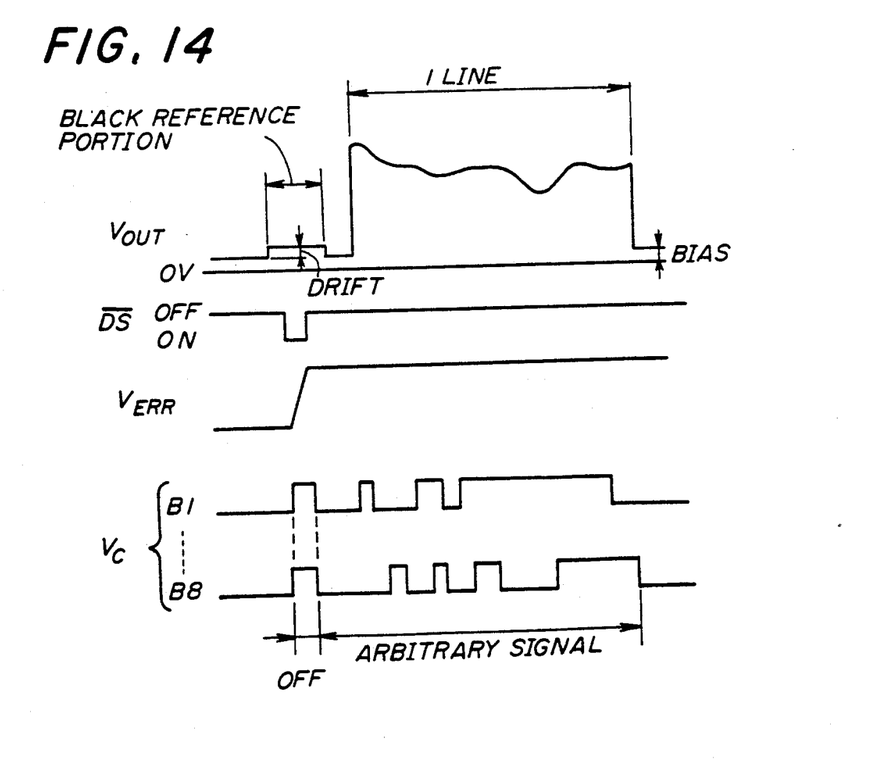
FIG. 14 is a signal timing chart for one line.

In the scanning process described above, the gain control circuit performs control of each scan line, in accordance with the timing chart in FIG. 14.

The timing signal $\overline{DS}$ which becomes effective in accordance with the optically shielded picture element signal portion (black reference portion) of the image signal output from the line image sensor 10 is then supplied to the gain control circuit. The width of this timing signal $\overline{DS}$ is either equal to or less than the width of the optically shielded picture element portion (black reference portion). During the time that the timing signal $\overline{DS}$ is effective, the gain control signal $V_C$ is set so that all of the bit (8 bits) are at the high level. This is to say that the gain in the gain control circuit is set to "1" (Refer to FIG. 2).

Then, the following description will be given of the case when the image signal (output voltage $V_{OUT}$ changes in the positive direction at the timing when the timing signal $\overline{DS}$ becomes effective as shown in FIG. 14. In this case, the operation of the inversion hold circuit 60 is as follows, when the timing signal $\overline{DS}$ becomes effective and the analog switch 62 turns on. On the basis of the output signals from the operational amplifier 22, the capacitor $C_1$ is charged. Then, the inversion amplification operation of the operational amplifier 61 causes the error voltage output $V_{ERR}$ from the operational amplifier 61 to become a negative voltage. This negative error voltage output $V_{ERR}$ is a voltage that is held in this inversion hold circuit 60. This error voltage output $V_{ERR}$ is fed back to the reference input terminal ($+V_{REF}$) of the D/A converter 21 via the resistor $R_9$. Because of this feed-back error voltage output $V_{ERR}$, the D/A converter 21 operates so as to cancel the change in the positive direction as has been described above. Accordingly, the black reference level corresponding to the black reference portion is held constant. Then, even after the signal of the optically shielded picture element signal portion (black reference portion) is input, the error voltage output $V_{ERR}$ held in the inversion hold circuit 60 is continued to be fed back to the D/A converter 21 until the scan of one line is complete. Accordingly, in the status where the positive change of the black level is removed, the gain control signal ($B_1$ through $B_8$) corresponding to the read picture element (cell) is supplied to the D/A converter 21 from the digital system 14(1) so that above described shading compensation is performed.

Figure 15A:
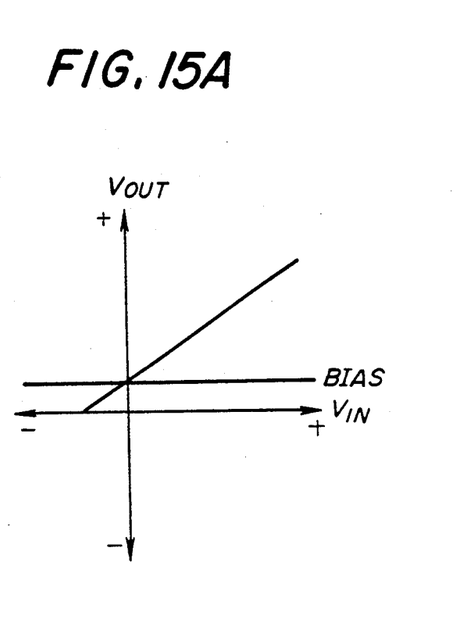
FIG. 15A and 15B are views indicating the input and output characteristics of the gain control circuit.
Figure 15B:
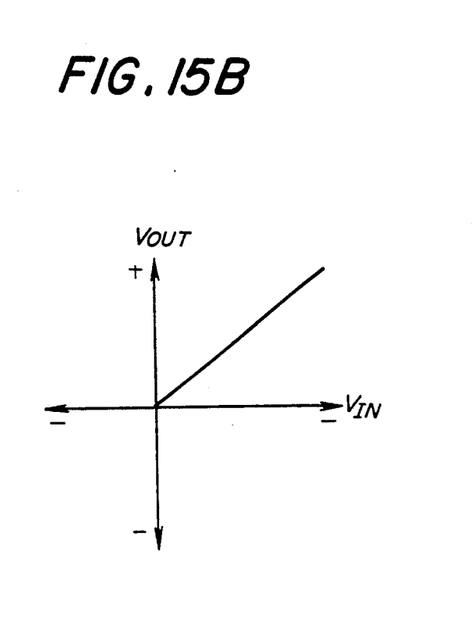

The input and the output characteristics when a bias circuit 63 is not provided for this gain control circuit are indicated in FIG. 15B. In a case where the usual black reference signal level is "0", for example, even when the input voltage $V_{IN}$ becomes negative, the output voltage $V_{OUT}$ does not become less than the usual reference signal level "0". Accordingly, the case when the input voltage $V_{IN}$ changes in the negative direction, is approximately equal to the case when there is no change for the black reference signal and so there is no control performed to cancel the negative direction change. The bias circuit 63 is provided in order to enable the feedback control so as to cancel this negative direction change of the input voltage $V_{IN}$. The bias circuit 63 always applies a positive bias to the reference input terminal ($+V_{REF}$) of the D/A converter 21. Because of this, the input and output characteristics of this gain control circuit are, as shown in FIG. 15A, such that the output voltage $V_{OUT}$ drops further when the input voltage $V_{IN}$ becomes lower than the usual black reference signal level "0". Accordingly, even in cases when the input voltage $V_{IN}$ changes in the negative direction, it is possible to have control so that change is removed. The bias voltage applied by the bias circuit 63 is adjusted to a suitable voltage by the variable resistor $VR_2$ in consideration of the change in the circuit characteristics of the D/A converter 21 and the operational amplifier 22, and the like.

Figure 16:
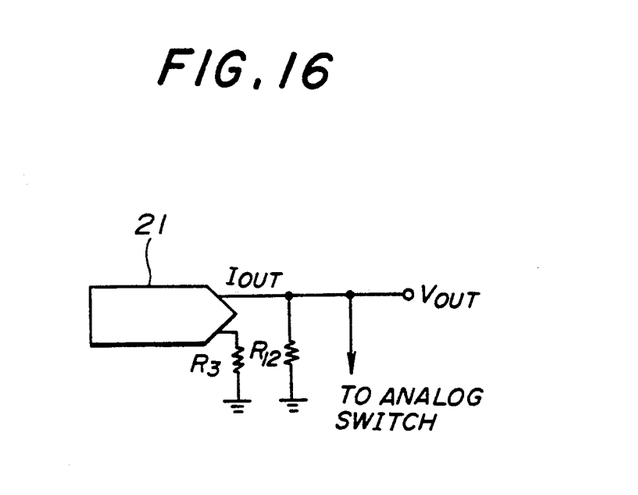
FIG. 16 is a view indicating a modification of a gain control circuit according to the present invention.

FIG. 16 is a view indicating a modification of the gain control circuit according to the present invention.

In the gain control circuit indicated in FIG. 16, there is a resistor $R_{12}$ connected between the ground and the output terminal of the D/A converter 21, in place of the operational amplifier 22 for current-voltage conversion in FIG. 12. Then, the output terminal ($I_{OUT}$) of the D/A converter 21 is directly connected to the analog switch 62.

In this modification, the output voltage $V_{OUT}$ is produced when the output current $I_{OUT}$ from the D/A converter 21 is supplied to the resistor $R_{12}$.

Figure 17:
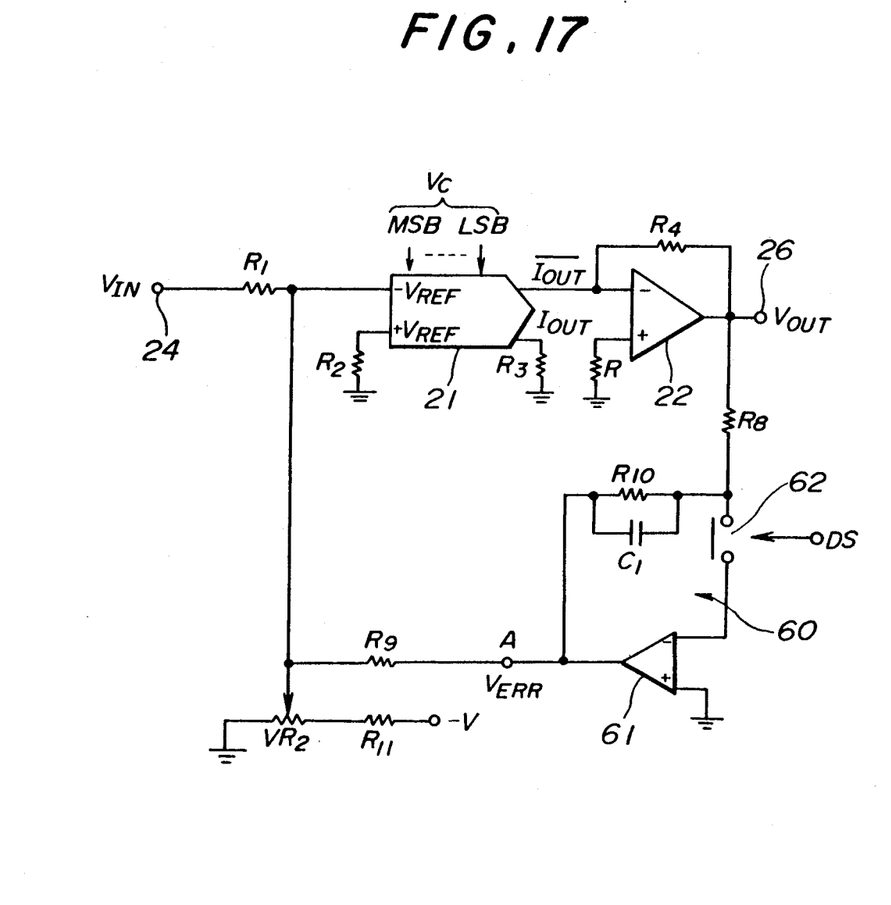
FIG. 17 is a view indicating another embodiment of a gain control circuit according to the present invention.

FIG. 17 is a view indicating another embodiment of the gain control circuit according to the present invention.

In the gain control circuit indicated in FIG. 17, the polarity of the reference input terminal of the D/A converter 21 and the power polarity of the bias circuit 63 are all different.

This is to say that the image signal is input to the reference input terminal ($-V_{REF}$) of the D/A converter 21 and the negative polarity current $I_{OUT}$ from the D/A converter 21 is input to the operational amplifier 22 and the variable resistor $VR_2$ is connected to the power source with a negative polarity voltage ($-V$).

In this embodiment, the polarity of the image signal ($V_{OUT}$) output from the terminal 26 becomes the opposite of the polarity of the image signal indicated in FIG. 12.

When a capacitor having a polarity is used as the capacitor $C_1$ in the inversion hold circuit 60, this capacitor $C_1$ is also used as the capacitor with an opposite polarity to that of the capacitor indicated in FIG. 12.

As has been described above, according to the present invention, even if there are changes in the characteristics of a circuit element due to fluctuations in the ambient temperature, and fluctuations in the power voltage, then control is performed so that a black reference level output (reference signal) having a predetermined level is always constant. Thus, it is possible to always have a stable image signal output with respect to this reference signal.

Accordingly, it is possible to have favorable shading compensation.

In addition, the fluctuation in the characteristics of circuit elements such as the D/A converter 21 are also accommodated so that a gate control circuit can be configured by inexpensive circuit elements.

Still furthermore, when a bias is applied to the reference input terminal of the D/A converter 21, regardless of whether those changes are in the positive or the negative direction, it is possible to cancel the changes.

Accordingly, it is possible to have further improvement in the shading compensation. Therefore, the among of characteristics change that can be accommodated by the circuit element becomes larger and it is possible to configure a gate control circuit that is even more inexpensive.

Further, the present invention is not limited to these embodiments, but various variations and modifications may be made without departing from the scope of the present invention.

What is claimed is:

1. A gain control circuit used in a shading compensation circuit comprising:
   signal processing means for inputting an image signal successively output from each of cells of a line image sensor and a gain control signal corresponding to shading data output from an external signal system and converting said image signal into a signal with a level corresponding to said gain control signal and for outputting a converted version of said signal as a compensation image signal, signal feed back means for inverting a reference compensation image signal and holding an inverted version of said reference compensation image signal and for feeding said inverted version of the reference compensation image signal back to a terminal of said signal processing means and to which said image signal is input, said reference compensation signal being obtained from said signal processing means when a reference gain control signal having a predetermined value and a reference image signal having a predetermined reference level are input to said signal processing means, the reference gain control signal being supplied from said external signal means, the reference image signal being included in a predetermined part of said image signal, and bias means for shifting a level of said image signal supplied to said terminal of said signal processing means by a predetermined level so that the reference compensation signal has a level greater than a predetermined value.

2. The gain control circuit as claimed in claim 1 wherein said reference gain control signal has a value corresponding to a gain of "1".

3. The gain control circuit as claimed in claim 1 wherein the reference image signal has a level corresponding to a predetermined black tone.

4. The gain control circuit as claimed in claim 1 wherein said signal feedback means has a sampling means for sampling said reference compensation image signal and a signal holding means for inverting said reference compensation image signal sampled by said sampling means and holding a inverted version of said reference compensation image signal until a following sampling is performed by said sampling means, and said inverted version of the reference compensation image signal is fed back to said terminal.

5. The gain control circuit as claimed in claim 1 wherein said bias means has a bias change means for changing a shift level of said image signal.

6. The gain control circuit as claimed in claim 1, wherein said bias means has a bias circuit which supplies a predetermined bias voltage to said terminal of said signal processing means so that a polarity of the reference compensation signal is positive.

* * * * *